United States Patent [19]

Lesyk

[11] 4,284,314

[45] Aug. 18, 1981

[54] TEST HEADS HAVING CONTACT PAIRS

[75] Inventor: Joseph N. Lesyk, Allentown, Pa.

[73] Assignee: Western Electric Co., Inc., New York, N.Y.

[21] Appl. No.: 98,428

[22] Filed: Nov. 29, 1979

[51] Int. Cl.³ .......................................... H01R 13/62
[52] U.S. Cl. ................................. 339/75 M; 29/882; 29/883; 29/884; 339/218 M
[58] Field of Search ................ 339/74, 75 M, 75 MP, 339/17 CF, 179, 218 R, 218 M, 276 S, 276 R; 29/882–884; 324/158 F, 158 P, 62, 64, 78.5

[56] References Cited

U.S. PATENT DOCUMENTS

| | | | |
|---|---|---|---|
| 3,573,617 | 4/1971 | Randolph | 324/158 |
| 3,618,207 | 11/1971 | Sand et al. | 29/629 R |
| 3,715,662 | 2/1973 | Richelman | 324/158 F |
| 3,728,607 | 4/1973 | Richelman | 339/193 P |
| 3,848,221 | 11/1979 | Lee | 339/74 R |
| 4,068,170 | 1/1978 | Chayka et al. | 324/72.5 |
| 4,090,293 | 5/1978 | van der Donk et al. | 339/218 R X |

OTHER PUBLICATIONS

Multipoint Test Probe, Wood et al., IBM Technical Disclosure Bull. vol. 18, No. 8, Jan. 1976, pp. 2453–2454.

Primary Examiner—Eugene F. Desmond
Attorney, Agent, or Firm—D. C. Watson; G. W. Houseweart

[57] ABSTRACT

A test head 90 having a plurality of contact pairs 81 is formed in a simple monolithic manner. A plurality of first conductors 74 are aligned in a first row and, spaced therefrom, a plurality of second conductors 80 are aligned in a second row. Each conductor has a circuit end and a contact end and each first conductor 74 registers with a mating second conductor 80 to form a plurality of contact pairs 81 at the contact ends.

A common base insulator 88 is formed transversely of the conductors 74 and 80 at the circuit ends to maintain conductor spacing in an electrically insulated manner. A common bar insulator 86 is formed transversely of the second conductors 80 to maintain the contact spacing within the pairs 81 when the conductors are flexed toward a device 27 to be tested.

In a method of making a test head 90, the conductors are made in patterns 56 from sheet 55 having a substantially uniform metallurgical composition and each pattern 56 includes a member 72 connected to the circuit ends of the conductors. After assembly, the connective member 72 is removed; therefore the position of each conductor relative to other conductors in a pattern 56 is maintained constant from the sheet 55 to the test head 90. The sheet 55 is advantageously made from a beryllium copper alloy which is susceptible to precipitation aging for hardness to obtain spring temper.

12 Claims, 8 Drawing Figures

FIG.-6
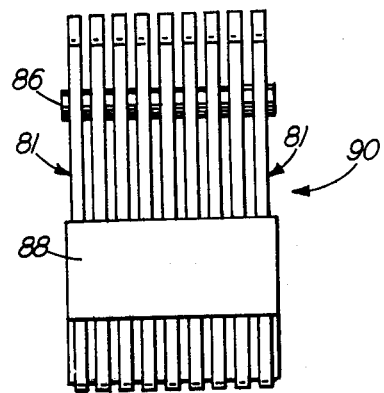
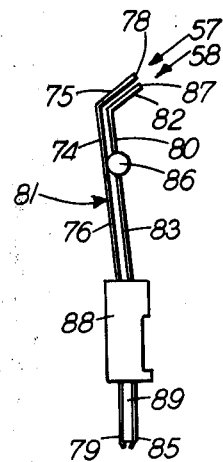
FIG.-7

TEST HEADS HAVING CONTACT PAIRS

TECHNICAL FIELD

This invention relates to test heads having a plurality of contact pairs and to methods of making such test heads. More particularly, the invention relates to test heads for simultaneously contacting all leads of a multiple leaded electronic device in which each individual lead is simultaneously contacted with a pair of related contacts.

BACKGROUND OF THE INVENTION

In the manufacture of semiconductor devices, chips embodying integrated circuits (ICs) are often contained in a package having a plurality of external leads extending therefrom. When such packaged devices are mounted to a circuit board for end use, it has been found advantageous to have the leads of the device aligned in one or more rows to suit a typical board layout. In a currently popular, lineally leaded package for ICs, the leads are aligned in two rows causing the device to be referred to as a dual inline package (DIP). Even in high volumes of production, most IC manufacturers test each circuit before delivery and it is therefore desirable to test such circuits rapidly and reliably.

In testing ICs, it is customary to contact each external lead with two related contacts, sometimes called a Kelvin pair. The primary purpose of using two contacts on each lead is to accurately measure a small voltage drop across an IC while such circuit is being tested. Typically, at a first contact made on a lead for such testing, a localized voltage drop is experienced which could affect measurement of circuit voltages. However, at a second contact made on the same lead, any localized voltage drop is typically negligible because the current flowing therethrough is negligible and better measurements are obtainable. The problem is to make proper contact of the Kelvin pair to a lead and to simultaneously make similar contact of similar pairs to each respective lead of the device to be tested.

Conventionally, DIPs have had from about 16 to about 20 external leads extending therefrom, although IC packages containing up to 40 leads are now not unusual. In testing such 40 leaded DIPs, it is mechanically challenging to simultaneously flex 80 spring tempered conductors of a test head toward 40 leads of a DIP and to effectively make 80 good, simultaneous contacts thereto. Nevertheless, this procedure must be repeated many times each minute to test such DIPs rapidly and reliably.

For a typical prior testing apparatus, the contacts were fabricated in pairs, separately from all other pairs. Such separate pairs were then aligned in two rows, spaced apart sufficiently to permit a DIP to be indexed between the rows and to permit reasonable clearances thereto. Once the DIP is in position, two opposing push rods act in unison to simultaneously flex all contacts in each row toward and against the leads of the DIP. It will be appreciated that uniformity in the performance of the contact pairs is important in achieving simultaneous and uniform contact and therefore good testing.

Typically in such conventional apparatus, the contact pairs are aligned in the rows by shimming and clamping base insulators which hold the contacts in a test fixture, a procedure which takes much time and patience. Since the pairs are very expensive and because they have a wide disparity of service life, it is customary to replace each pair separately as it wears out. Such replacement disturbs the shimming and alignment of adjacent pairs in the row, thereby requiring costly labor and down time to realign the pairs. It is therefore desirable to improve the apparatus for testing DIPs so costly labor and down time can be minimized.

SUMMARY OF THE INVENTION

In view of the foregoing, it is an object of this invention to provide improved test heads having contact pairs for testing DIPs and other lineally leaded devices. It is also an object of the invention to provide methods of making such test heads.

With these and other objects in mind, the present invention includes a test head having a plurality of uniformly flexible conductors ending in probe-contact pairs such that the contact spacing in one pair is maintained substantially the same as the contact spacing in each of the other pairs. A plurality of spaced first conductors are aligned in a first row and another plurality of spaced second conductors are aligned in a second row. Each of said first and second conductors has a contact end and a circuit end and said second row is spaced from the first row such that each second conductor registers with a mating first conductor, thereby forming a plurality of contact pairs at the contact ends of the conductors. A common base insulator is formed transversely of the first and second conductors at the circuit ends to maintain the conductor spacing in an electrically insulated manner. A common bar insulator is formed transversely of the second conductors to maintain the contact spacing within the contact pairs substantially uniform when the conductors are flexed toward a device to be tested.

In a specific embodiment each conductor includes a probe section at the contact end and a cantilever-spring section extending from the probe section to the circuit end. An angle is formed at the region in each first conductor where the probe section meets the cantilever-spring section, thereby projecting from such cantilever-spring section a probe-contact of a first length in the first conductor such that the probe terminates at a contact area suitable for the leads of a device to be tested. Similarly, an angle formed in each second conductor causes a probe-contact of a second length to project from the second conductor such that the probe also terminates at a suitable contact area.

In a method of making a test head in accordance with the invention, a first pattern and a second, mating pattern of conductors are formed from sheet material having a uniform metallurgical composition. Connective members in the patterns maintain constant the position of each conductor in each pattern relative to the other conductors in the respective pattern as the patterns are formed from the sheet. After the patterns are positioned and the test head is formed, the connective members are removed so the relative positions of the conductors are maintained constant from the sheet to the test head.

BRIEF DESCRIPTION OF THE DRAWING

Other objects and advantages of the invention will be more readily understood from the following detailed description when read in conjunction with the accompanying drawing, wherein:

FIG. 6 is a side elevation of a lineally arranged group of contact pairs including a common base insulator, formed in accordance with the instant invention.

FIG. 7 is an end view of the lineally arranged contact pairs shown in FIG. 6 further illustrating probe-contact pairs projecting uniformly from the conductors.

Figure 1:
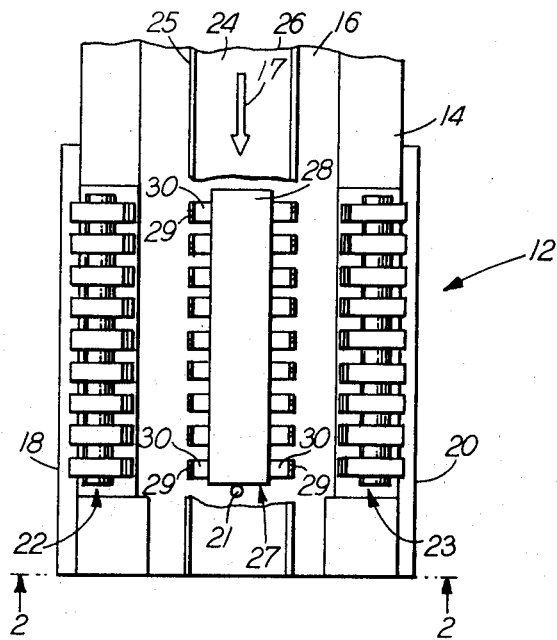
FIG. 1 is a plan view of apparatus for testing DIPs, illustrating test heads containing contact pairs.

It can be seen that various figures are simplified to highlight aspects and features of the invention and thus promote a better understanding of the subject matter. Also, where appropriate, the same reference numerals have been repeated in the various figures to designate corresponding features in the drawing.

DETAILED DESCRIPTION

A test head like that of the present invention is usually a component in a larger apparatus for rapidly testing lineally leaded devices such as DIPs. One such apparatus which uses such test heads in the manner to be described is sold by Micro Component Technology, Inc. of St. Paul, Minn. as its Model 2608E.

Referring to FIG. 1, there is shown a plan view of a portion of such apparatus for testing DIPs, which portion is designated generally by the numeral 12. A base 14 includes a recessed center section 16 and two clamping bars 18 and 20. A test head 22 is held in place by bar 18 and an opposite-hand test head 23 is held in place by bar 20. Between the two test heads there is provided a track 24 which can be seen more clearly in the front view of apparatus 12 shown in FIG. 2. The track 24 is located on a support 26 which is set at a height to suit the structure of a device to be tested as such structure relates to the test heads 22 and 23. The track 24 has side portions 25 to retain a device within track 24 as such device is indexed according to the arrow 17 in FIG. 1 into the position shown for testing. An escapement pin 21 stops the device at the desired testing position, as shown in FIGS. 1 and 2.

THE LINEALLY LEADED DEVICES

The packaging of ICs has been influenced to a large extent by the way such packages are oriented on a P-C board for end use. For these and other reasons there has been a tendency toward lineal orientation of the packages, which has led to elongated packages having lineally arranged leads extending therefrom.

Figure 2:
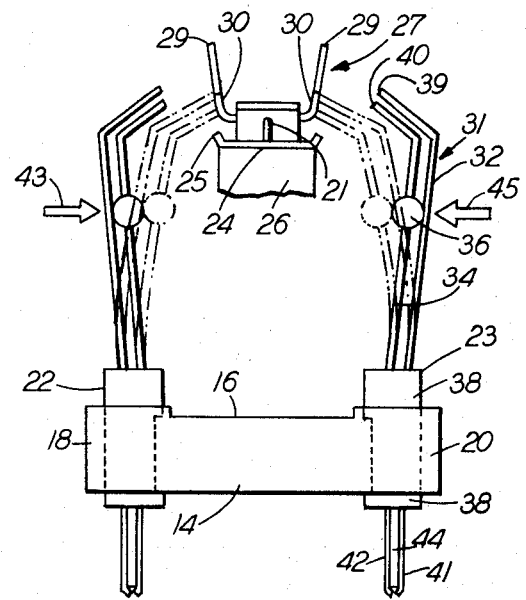
FIG. 2 is a front view of the apparatus shown in FIG. 1, further illustrating an operational flexing of the contact pairs in the test heads.

In FIGS. 1 and 2 there is shown a DIP 27 which is typical of a lineally leaded device. The DIP 27 has an elongated box-like body 28 which contains at least one semiconductor chip (not shown) embodying an IC. In a typical example, the IC is connected to the outside world through 18 external leads 30. Such leads 30 project from opposite sides of the body 28 in two rows and all the leads 30 are bent in a common direction as shown. Each lead 30 is contoured starting near the bent area to acquire thin pins 29 which are typically pointed to facilitate insertion into P-C boards.

It is not uncommon, in the manufacture of DIPs, to have individual pins 29 bent out of line or to have one or more pins missing, having been broken off near the bent area during processing. Although the invention will be explained primarily with regard to the DIP 27, it is to be understood that other lineally leaded devices containing other numbers of leads and having different body configurations could as well be tested using the heads of the instant invention.

THE TESTING PROCEDURE

With the DIP 27 positioned in the apparatus 12 for testing, each lead 30 in a row is opposite to and in registration with a contact pair designated generally by the numeral 31. At the beginning of each test, a continuity check is run on each contact pair 31 by directing a current pulse along a first contact in the pair 31 into a lead 30 and returning along the second contact of the pair 31 to establish that both contacts in the pair 31 are electrically connected to an existing lead. Failure of continuity can mean either that contact is ineffectively made or that the intended lead is missing.

Components such as the pairs 31 are customarily referred to as contacts even though parts thereof may be separately named according to function. Also, the area between rows of contact pairs is designated as an inner area to differentiate over more remote areas which are designated as outer areas.

Each pair 31 includes an outer conductor 32 having a contact end 39 and a circuit end 41 and an inner conductor 34 having a contact end 40 and a circuit end 42. Both conductors 32 and 34 in a pair 31 extend through and are embedded in a base insulator 38. The base insulator 38 has an extension 44 which spaces and supports the circuit ends 41 and 42 of the conductors 32 and 34. Also, the circuit ends 41 and 42 are crimped over the end of the insulator extension 44 to facilitate insertion of such circuit ends into a socket containing terminals of a test set (not shown). Each row of contact pairs 31 is referred to as a test head whether such pairs 31 are separately formed and clamped together or whether the pairs 31 are interconnected as will be described later.

In an ideal operation of the apparatus 12, all outer conductors 32 of test head 22 are engaged by means (not shown) which thrusts them toward the DIP 27. Simultaneously therewith, all outer conductors 32 of test head 23 are similarly engaged and thrust toward the DIP 27 in the opposite direction, such directions being indicated by the arrows 43 and 45. Each outer conductor 32 presses against a spacer insulator 36 which causes each inner conductor 34 to be flexed toward the leads 30 of the DIP 27. Each of the conductors is spring tempered and is flexed in a cantilevered manner from base insulator 38.

Ideally, all the conductors act precisely in unison and the contact ends 39 and 40 move in an arcuate path with respect to the tops of the base insulators 38. When the ends 39 and 40 contact the leads 30, such ends can no longer continue in the arcuate path. Each end 39 and 40 then exerts a moderate pressure upon a respective lead 30 and such ends 39 and 40 move slightly upward in wiping contact with the lead. Such wiping movement tends to produce a clean, contact area which is ideally suited for good electrical connection.

It is typically found, in a non-ideal operation, that trouble may be experienced because of misshaped contact pairs 31. However, such misshaped pairs do not necessarily cause incomplete or unreliable testing. Each thrusting means, acting in accordance with the arrows 43 and 45 in FIG. 2, is typically designed to push uniformly over a line transverse to the contacts so that misshaped contacts can often be aligned thereby and flexed toward the DIP to be tested. Also, the thrusting distance and pressure are typically set to compress the contacts against the leads sufficiently to temporarily re-shape some troublesome contacts, at least for the short contact time interval. It will be appreciated, however, that such thrusting to flex misshaped contacts repeatedly in a testing operation can cause entanglement and ruin of good, adjacent contacts and destruction of leads on devices being tested. Shortened and erratic service life of the flexing contact pairs 31 would be expected in troublesome operations and such has often been the case in the prior art.

THE PRIOR ART

Figure 3:
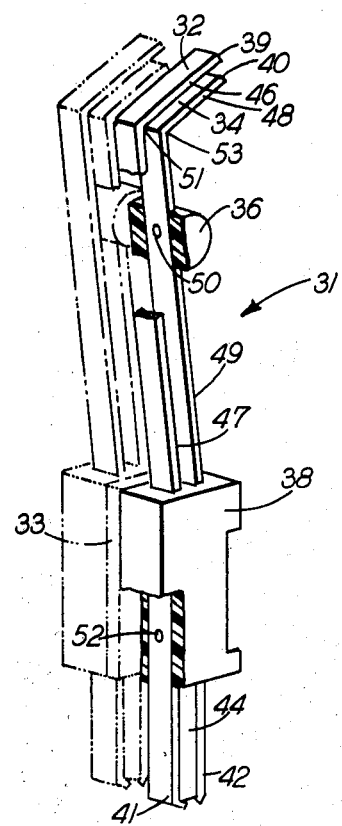
FIG. 3 is a partially cut-away, pictorial view of a prior art, contact pair formed separately from other pairs.

Referring to FIG. 3, there can be seen a contact pair 31 which has been made as a separate unit in accordance with the prior art. An inner conductor 34 is formed from an elongated strip of electrically conductive metal. Conductor 34 has a given angle formed therein at a region 53, which causes a probe section 48 to project in a direction toward which the pair 31 is to be flexed. The probe section 48 functions as a relatively stiff and straight probe-contact in making good electrical connections. A cantilever-spring section 49 of the conductor 34 extends from region 53 to a circuit end 41. However, it is apparent that the section 49 cantilevers only from the top of insulator 38. An outer conductor 32 has features 51, 46, 47, and 42 which are similar to and complemental with the features described with respect to the conductor 34. The contact end 39 of an outer conductor and the contact end 40 of an inner conductor form the contacts of a pair 31.

The conductors 32 and 34 are conventionally made of a high grade metal alloy which is chosen for good electrical conductivity, for corrosion resistance, for wear resistance, and for ability to maintain spring temper, typically in that hierarchical order of importance. Such metal typically contains about 30% silver, 43% palladium, 2.5% platinum, 11% gold, and the remainder of copper. Because of the high cost of such alloy, the conductors are typically made from strip material of the required conductor width, such being the most effective way to avoid waste remnants of material. Strip material is also used because the high grade metal alloy is typically hardened by working rather than by heat treatment and strip can be effectively work hardened as the stock metal is rolled or drawn to obtain the desired cross section. The strip is typically coiled upon a reel for storage and, as it issues therefrom, the conductors are stamped out for the contact pairs 31.

It can be seen that an insulator 36 is molded about the inner conductor 34 before the conductors 32 and 34 are joined together at the circuit ends thereof by a base insulator 38. Note that holes 50 and 52 have been punched in the strip at locations to suit the insulators 36 and 38. It is believed that these holes are of significance in the prior art test heads. More particularly the holes permit hot, fluid material to flow therethrough during the process of forming the insulators 36 and 38. The insulators are typically molded using a nylon plastic material which is very tough and which has a low coefficient of surface friction in the final product. The holes are typically made about 0.020 inches in diameter which is about one-third the width of a typical 0.060 inch wide conductor. The space between the conductors, measured along the length of the test head, is typically 0.040 inches, which is usually considered adequate to electrically insulate the conductors from each other. However, at this spacing the material of the insulators which is molded on the thin edge of the insulators is less than 0.020 inches thick, allowing for manufacturing tolerances. Therefore the round, connective member formed through the hole is a significant contribution to the strength of an insulator. Also, since most plastics, including nylon, do not bond reliably well to the type of high grade metal used in the conductors, the hole member is of significance in maintaining the insulators in the desired positions. These considerations are believed to be particularly important to the performance of insulator 36 in operation of the pair 31.

When pressure is laterally applied to an outer conductor 32, the insulator 36 receives the full pressure required to flex both conductors 32 and 34. It will be appreciated that, as both conductors are flexed in an arc, the outer conductor 32 tends to rub over the insulator 36. When a contact end 40 bears off center on a lead 30, the conductor 34 is twisted about its longitudinal axis which also twists the insulator 36 while it is under pressure. Therefore, it is believed that the hole member in the insulator 36 is of importance to prevent it from being dislodged from its desired position.

Problems which develop with the prior art pairs 31 generally involve distortion, and therefore misshaping of the conductors 32 and 34. When either type of conductor becomes misshaped, the required registration of the contact ends 39 or 40 to device leads 30 is affected and the twisting effects noted above are experienced. Moreover, the causes of conductor distortion have not heretofore been fully understood. A slight misregistration or uneven pressure on the contact end of one conductor can cause intolerable distortion and aberrant behavior of a pair 31 while the same events will have little effect on other contact pairs 31. It is believed that the unpredictable behavior of the pairs in service has contributed to the introduction of the hole for insulator 36 and the thickness of the metal now used to make the conductors more serviceable.

In placement of the pairs 31 to form a test head, the bars 18 or 20, shown in FIG. 1, are removed and the pairs 31 are aligned into position to suit the number of leads 30 and the spacing of such leads in the device to be tested. Typically such leads have a spacing center-to-center of about 0.100 inches so small errors in positioning the pairs 31 can be detrimental to proper contact especially if such errors are cumulative in a given direction. It is typically found that the base insulators 38 are somewhat undersize in width, probably to suit the minimum spacing of various DIPs to be tested. However, such insulators 38 are not uniformly undersized. Therefore, adjustments for error are generally cumulative but irregular. In FIG. 3., a neighboring contact pair 31 is shown in phantom to indicate the insulator irregularities which are typically experienced. The lateral positioning of the contact ends, which is of prime importance in contacting the leads 30 of a DIP, is adjusted as shown by inserting a typical shim member 33 between the base insulators 38. Also, badly misshaped contacts are manually reshaped when necessary before they are placed and aligned. After the pairs are aligned to suit a device, the bars 18 and 20 are clamped to secure all pairs in the test head. In a typical placement of the prior art pairs 31 in a test head, small irregularities of shape between such pairs is easily discernible with the naked eye.

It will be appreciated that shimming and clamping have also been practiced in the prior art in keeping costly replacement of pairs to a minimum. For example, if a DIP has bent leads or missing leads, one or more pairs may experience non-ideal flexing. In another example, a pair may be found to contact a lead in an off-center manner causing twisting of the conductors. Such flexing and twisting can cause distortion of a conductor and aberrant behavior of a pair of contacts 31. However, by shimming and clamping, certain adjustments can be made and a misshaped pair often can be made to contact properly. On the other hand, the down time required for such adjustments and the cost of skilled labor required to do them have caused testing engineers to look for alternatives.

Heretofore, mass replacement of the separate pairs has not typically been feasible because of the disparate service life of the pairs and because of their high cost. Similarly, it has not been deemed logical to bond or otherwise connect the pairs together because of the irregularities in form and of performance of the pairs in service. Moreover, to form a multiple leaded test head as a monolithic unit, several mechanical fixtures are seen to be needed, each designed to suit a given test head. Such fixtures hold a given number of detached, physically separate, strip conductors at one time with the required precision while the insulators are formed to hold the conductors together.

It has been found, however, that a group construction of test heads can be made feasible. For example, in an operation where the smallest device to be tested has two rows of 9 leads each, it has been found that a monolithic construction of 9 pairs in a test head can be economical. Thereafter, for devices having a different number of leads, such groups can be cut into smaller sub-groups and used alone or mated with groups of 9. The groups and sub-groups are then clamped or bonded together to obtain the desired number of pairs in a test head.

MAKING MONOLITHIC TEST HEADS

Figure 4:
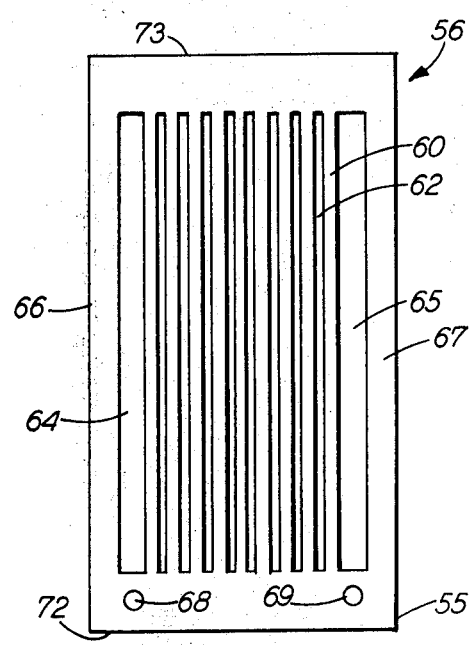
FIG. 4 is a plan view of a pattern of conductors formed in accordance with the instant invention.

Referring to FIG. 4, there is shown a group of conductors formed in a lead frame environment in accordance with the instant invention. A pattern 56 is formed from electrically conductive sheet material 55. Such pattern 56 includes a plurality of conductors 60 separated from each other by preferably uniform spaces 62 and separated from side frame members 66 and 67 by relatively large spaces 64 and 65, respectively. Such large spaces 64 and 65 advantageously separate the conductors 60 from side edge areas where distorting stresses are typically found to reside.

The conductors 60 are supported at the top by a frame member 73 and at the bottom by a frame member 72. A left, bottom hole 68 and a right, bottom hole 69 are provided to align and secure the framed pattern 56 in fixtures (not shown) for further processing.

The pattern 56 can be formed from the sheet material 55 by many conventional sheet metal working techniques such as stamping, punching, or shearing. Such techniques are typically thought to be desirable because metal in unwanted areas such as spaces 62, 64, and 65 can be salvaged for scrap, as can the metal in the temporarily used frame members 66, 67, 72, and 73. Such salvage is particularly important when costly, high grade alloys are used for sheet 55. On the other hand, when the cost of the metal in sheet 55 is not a serious consideration, forming the pattern 56 by photo-etching techniques has been found to produce excellent results even though metal from spaces 62, 64, and 65 is dissolved in the etching process. One desirable result is that a high degree of precision in line placement is obtained so the conductors are made closely uniform in dimension. Moreover, in the conventional techniques of cutting sheet metal, it is inherent that some unwanted work hardening take place, especially along the cut edges and such hardening is essentially avoided by using photo-etching techniques.

Figure 5A:
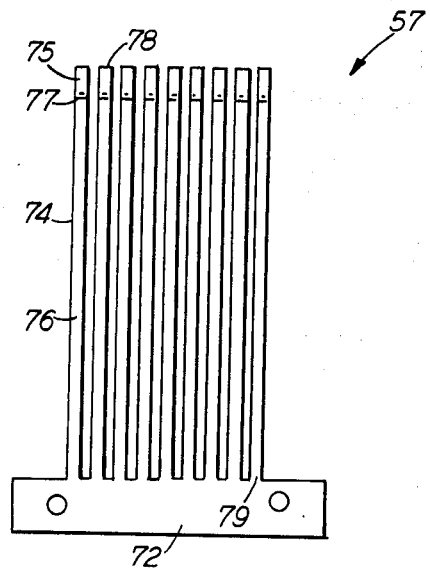
FIG. 5A is a plan view of a pattern of outer conductors formed in accordance with the instant invention.

Referring then to FIG. 5A, there is shown a plan view of a pattern 57 with frame members 66, 67, and 73 removed. The conductors 60 of FIG. 4 have been cut to proper length to form outer conductors 74 and a given angle has been uniformly produced in each conductor at a region 77. Said angle separates a top section 75 suitable for probe purposes from a bottom, cantilever-spring section 76 in each conductor 74. The angle at region 77 in each conductor 74 causes the probe sections 75 to uniformly project away from the principal plane of the pattern 57. Note that the bottom frame member 72 has been retained to preferably maintain constant the position of one conductor 74 relative to the other conductors 74 as the group of such conductors 74 are formed from the sheet 58.

Figure 5B:
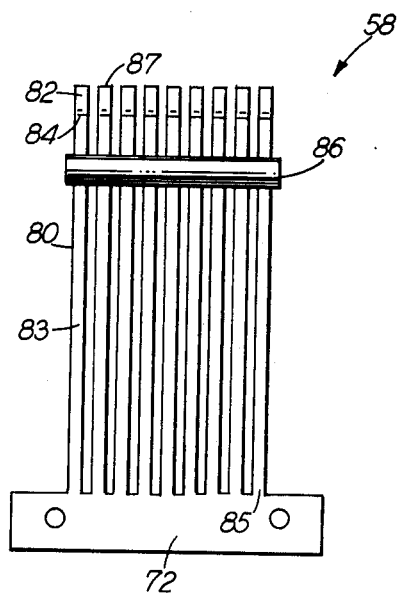
FIG. 5B is a plan view of a pattern of inner conductors including a common bar insulator formed in accordance with the instant invention.

Referring to FIG. 5B, there is shown a plan view of a pattern 58, also with frame members 66, 67, and 73 removed. The conductors 60 have been cut to proper length to form inner conductors 80 and features 84, 82, and 83 have been formed in a corresponding manner to those formed in the pattern 57 shown in FIG. 5A. Note also that the bottom frame member 72 has been retained to preferably maintain constant the position of one conductor 80 relative to the other conductors 80 as the group of such conductors 80 are formed from the sheet 58.

It will also be noted that a common bar insulator 86 has been formed transversely of the group of conductors 80. The bar insulator 86 is a continuous bar of electrically insulative material which is molded along and about each conductor and secures the array of conductors firmly together. Preferably, the insulator 86 is of uniform cross section and sufficiently strong along its length that forces imparted to ones of the conductors 80 are substantially distributed through the continuous bar to the other conductors 80. It has been found that since the bar 86 is molded about a multiplicity of conductors rather than just one (as in the prior art), such forces can be distributed by the insulator bar 86 without risk of dislodging such bar 86, even though no holes are provided in the conductors 80. A suitable material which can be used to form the insulator 86 is a molding compound sold as Hysol MH10 by Dexter Corporation of Olean, N.Y.

The pattern 57, shown in FIG. 5A, and the pattern 58, shown in FIG. 5B, are typically not identical in size. In particular, the sections 75 and 76 of each outer conductor 74 are made slightly longer than the sections 82 and 83, respectively, of each inner conductor 80 to accommodate the angular shape in the conductors when the patterns are mated together. Each pattern 57 is said to have a mating pattern 58 and each outer conductor 74 is said to have a mating, inner conductor 80. Such designation is made to indicate that each outer conductor 74 is positioned with, and made to function with, a particular inner conductor 80. It will be further noted that, when the patterns 57 and 58 are positioned to form a test head, each feature of an outer conductor 74 will be opposite to, and therefore considered to be in registration with its mating, inner conductor 80.

Referring now to FIG. 6, there is seen a side elevation of a lineally arranged group of contact pairs which have been monolithically formed into a test head in accordance with the instant invention. Further, in FIG. 7 there is shown an end elevation of the same test head. Note that the pattern 57 of outer conductors 74 has been positioned in a spaced relationship with the pattern 58 of inner conductors 80 such that each conductor 74 touches the common bar insulator 86 and registers with a mating conductor 80 in the pattern 58. Each outer conductor 74 has a contact end 78 and a circuit end 79. Similarly, each inner conductor 80 has a contact end 87 and a circuit end 85.

The angles which have been uniformly formed at the place in the conductors where the probe sections meet the cantilevered-spring sections cause uniformly shaped probe-contacts 75 of a given length to project from the outer conductors 74 and uniformly shaped probe-contacts 82 of a slightly shorter length to project from the inner conductors 80. Each probe terminates in an area such that, when the pair 81 is flexed onto a lead 30, the contacts will be suitable for a device to be tested.

A common base insulator 88 has been formed transversely of both patterns of conductors at the circuit ends thereof such that the contact spacing in one pair of contacts 81 is maintained substantially the same as the contact spacing in each of the other pairs 81 in the test head. The insulator 88 is a continuous bar of electrically insulative material which is molded along and about each conductor, and secures the conductors in the test head firmly together. Preferably, the insulator 88 is of uniform cross section and sufficiently strong along its length that forces imparted to ones of the conductors are substantially distributed through the continuous base to the other conductors 74 and 80. It has been found that such forces can be distributed by the common insulator 88 without risk of dislodging the insulator 88 even though no holes are provided in the conductors 74 and 80. It should be further noted that the common insulator 88 also has a common extension 89 to space and support the circuit ends 79 and 85, respectively, of the conductors 74 and 80. The tips of the circuit ends 79 and 85 are crimped over the end of extension 89 to facilitate common and simultaneous insertion of the circuit ends 79 and 85 into a common socket containing terminals of a test set (not shown). A suitable material which can be used to form the insulator 88 and the extension 89 is the same compound Hysol MH10 mentioned previously for forming the bar insulator 86.

It will be appreciated that the former practice of positioning and clamping each separate insulator 36 of the prior art pairs 36 to form a test head was a time consuming task. By forming such insulators in a common base, such labor is reduced, the test head is made stronger, and the clamping apparatus can be simplified.

It can be seen in FIG. 7 that the conductors 74 and 80 have been deflected backward from a vertical line as was done in the pairs 31 of the prior art. Although such deflection is done to accommodate testing apparatus now in service, it is not felt that such deflection should continue to be necessary. It is believed that test heads made in accordance with the instant invention do not require the clearances formerly needed for the prior art pairs 31.

Referring now to FIGS. 5A, 5B, and 6, it can be seen that the connective members 72 found in the patterns 57 and 58 do not appear on the test head shown in FIGS. 6 and 7. However, it is to be understood that the members 72 preferably remain connected to the respective patterns until after the common base insulator 88 is molded. Then each connective member 72 is removed from each respective pattern whereby the relative positions of the conductors 74 and 80 in each respective pattern are maintained constant from the sheet to the test head.

It has been found that, by forming test heads according to the group method described above, substantial advantages can be obtained. Moreover, it is believed that the advantages build upon each other in such a manner that the total result is not what a man of ordinary skill in the art would expect.

For example, it has been mentioned that the holes formerly used to secure the insulators 36 and 38 can be eliminated by monolithically making test heads. By eliminating the holes, a 50% increase in conductor strength is typically gained at the formerly weakest place in the inner conductors. This advantage would suggest that the thickness of the conductors could be reduced to save on the cost of high grade metal alloys or indeed that cheaper metals could be used.

As previously mentioned above, in the conventional hierarchy of characteristics sought in metals for the conductors, high conductivity has been seen to be paramount. However, it has been found that, at a modest sacrifice in metal conductivity, metals having substantially improved mechanical advantages can be used.

For example, it has been found that beryllium copper alloys are advantageously used to make such test heads. Such alloys have good conductivity and reasonably good resistance to corrosion. The strip or sheet made from the alloys can be work hardened or such material can be hardened by precipitation aging, a process which is believed to be highly advantageous in the practice of the invention because it provides uniform and controlled spring temper in the conductors.

In a presently preferred example, patterns 56 are formed from sheet 58 made of a beryllium copper alloy such as CA-172-Berylco 25HT, sold by Beryllium Corporation of Reading, Pa. Such alloy is generally heated by the manufacturer sufficiently to diffuse the beryllium into solution after which it is cooled to room temperature and sold in sheet form for fabrication. The sheet is of substantially uniform metallurgical composition, including hardness condition, at least throughout an area of the size needed to form a pattern 56, e.g., about 1×2 inches. It is further desirable that the uniform composition extend over an area large enough to form each of such patterns 56 which contain conductors for the same test head.

A pattern 56 is formed from such sheet preferably by photo-etching techniques, and the pattern is preferably oriented so the conductors are formed parallel to the direction of grain in the sheet; i.e., parallel to the direction in which the crystalline structure extends. Thereafter, the pattern 56 is placed under pressure and heated to about 600° F. for about 2 hours. During this period, precipitation of beryllium along the metal grain boundaries takes place and the metal is thus hardened to obtain spring temper which is such as will fully return the conductors 74 and 80 to their original shape after every flexing cycle. In the preferred example, the conductors 74 and 80 are found to be hardened satisfactorily when a reading of from about 40 to about 45 on the Rockwell "C" Scale is noted in testing for adequate spring temper.

Test heads which are made according to the presently preferred example have been found to have contacts which are so closely uniform in appearance that irregularities are not typically noticeable to the naked eye. Also, such test heads exhibit superior performance over those of the prior art. For example, prior art pairs of contacts typically had to be replaced before such pairs had been flexed through about 300,000 cycles. Contact pairs, made in accordance with the preferred example average about 1,500,000 flexing cycles and the pairs in some heads have been flexed for as many as 5,000,000 cycles. The aberrant flexing behavior seen in the prior art is substantially unnoticeable with test heads made in accordance with the invention and, therefore, more uniform service life of pairs is typically experienced.

When higher conductivity, better corrosion resistance, and improved contact wear resistance is desired in the conductors made in accordance with the invention, such can be obtained by gold plating the conductors. For example, gold plating can be advantageously applied at any step after the patterns are formed and cut to length. For best results it is found desirable to use a hard gold plate and to apply the same after the connective members 72 are removed from the assembled test heads.

Test heads made in accordance with the preferred example, even after gold plating, have been found to be less costly than those of the prior art. For example, in making a two-row set of heads to test an eighteen-leaded DIP, the costs are only from about 10 to about 15% of the costs experienced in the prior art. Such lower first costs, coupled with the longer service life of the monolithically made test heads, provide a large part of the unexpected results referred to above.

The term "monolithic" has been applied herein because the conductors are preferably made in groups from a singular sheet of material and because the bonded jointure of conductors to insulators connotes overall monolithic construction. The term "unitary" is also typically applied to a structure having parts durably and inseparably bonded together, for example, by welding as in many automobile bodies. Consequently, the term "unitary" is hereby incorporated to further emphasize that the conductors are durably bonded to the insulators and not just detachably joined by clamping or by similar mechanical fastening.

It will be appreciated that the invention described herein is not limited to test heads having contact pairs. Heads having non-paired contacts and/or rows of differently shaped contacts could as well be monolithically constructed as described above. For example, the angle produced in each of the conductors, as shown in FIG. 7, is typically about 123 degrees in magnitude, measured internally between the probe section and the cantilever-spring section of each conductor. However, such angle can be varied so suit the leads of a device to be tested.

It is further believed that the methods of forming apparatus of metal members which are closely uniform in appearance and performance extends to applications outside the electronics industry. More particularly, metal members which are shaped and which are flexed or otherwise manipulated in service typically exhibit uniformity problems. Such problems are uniquely solved by the methods of the present invention.

There have been illustrated herein certain practical embodiments of the invention and certain applications thereof. Nevertheless, it is to be understood that various modifications and refinements may be made and used which differ from these disclosed embodiments without departing from the spirit and scope of the instant invention.

I claim:

1. A unitary test head having a plurality of uniformly flexible conductors ending in probe-contact pairs such that the contact spacing in one pair is mantained substantially the same as the contact spacing in each of the other pairs, comprising:

a plurality of spaced first conductors formed in one or more groups and aligned in a first row;

a plurality of spaced second conductors formed in one or more groups and aligned in a second row, each of said first and second conductors having a contact end and a circuit end and said second row being spaced from the first row such that each first conductor registers with a mating second conductor, thereby forming a plurality of contact pairs at the contact ends of the conductors;

a common base insulator formed transversely of and bonded to each of the first and second conductors at the circuit ends thereof such that said conductors and said rows are maintained in the aformentioned spaced relationships in an electrically insulated manner; and a common bar insulator formed transversely of and bonded to each of the second conductors along a corresponding portion of each of said second conductors, said portion being located between the base insulator and the contact ends of the second conductors, such that the said bar insulator is separate from but bears upon the first conductors and maintains the contact spacing within the contact pairs and between each pair substantially uniform when the conductors are flexed toward a device to be tested.

2. The test head of claim 1 wherein each conductor includes a probe section at the contact end and a cantilever-spring section extending from the probe section to the circuit end, further comprising:

an angle formed at the region in each first conductor where the probe section meets the cantilever-spring section, thereby projecting from such cantilever-spring section a probe-contact of a first length in the first conductor such that the probe terminates at a contact area suitable for the leads of a device to be tested; and an angle formed at the region in each second conductor where the probe section meets the cantilever-spring section, thereby projecting from such cantilever-spring section a probe contact of a second length in the second conductor such that the probe terminates at a contact area suitable for the leads of a device to be tested.

3. The test head of claim 2 wherein the cooperative effect of the base insulator and the bar insulator maintains the cantilever-spring sections of the first conductors uniformly spaced in a planar array and, parallel thereto, the cantilever-spring sections of the second conductors uniformly spaced in a planar array; and the angles in the first conductors are equal and of a first magnitude and the angles in the second conductors are equal and of a second magnitude, such that the probe-contacts project from the cantilever-spring sections of the first conductors uniformly in a planar array and, parallel thereto, the probe-contacts project from the cantilever-spring sections of the second conductors uniformly in a planar array.

4. The test head of claim 3 wherein the first angular magnitude is equal to the second angular magnitude.

5. The test head of claim 2 wherein the first and second conductors are imperforate flat members having substantially straight edges and wherein the common base insulator further comprises:
 a continuous base of electrically insulative material molded along and about the first and second conductors such that said conductors are secured together, said base being of uniform cross section and sufficiently strong along its length that forces imparted to ones of the conductors are substantially distributed through the continuous base to the other conductors.

6. The test head of claim 5 wherein the common bar insulator further comprises:
 a continuous bar of electrically insulative material molded along and about the second conductors such that said conductors are secured together, said bar being sufficiently wide to uniformly touch the first conductors and being of uniform cross section and sufficiently strong along its length that forces imparted to ones of the second conductors are substantially distributed through the continuous bar to the other second conductors.

7. A method of making a test head in a substantially unitary manner having a plurality of uniformly flexible conductors ending in probe-contact pairs such that the contact spacing in one pair is maintained substantially the same as the contact spacing in each of the other pairs, comprising:
 forming a first pattern and a second, mating pattern from electrically conductive sheet material such that each pattern includes a plurality of spaced conductors, each having a contact end and a circuit end;
 forming a common bar insulator transversely of and bonded to each of the conductors in the second pattern along a corresponding portion of each of said conductors, said portion being located between the circuit ends and the contact ends of the said conductors;
 positioning the first pattern in a spaced relationship with the second pattern such that each conductor of the first pattern touches the bar insulator and registers with a mating conductor in the second pattern, thereby forming a plurality of contact pairs at the contact ends of the conductors; and
 forming a common base insulator transversely of and bonded to each of the conductors at the circuit ends thereof to maintain the aforementioned spaced relationships in the test head.

8. The method of claim 7, further including the step of forming in each conductor a probe section at the contact end and a cantilever-spring section extending from the probe section to the circuit end by forming an angle in each conductor, thereby projecting a probe-contact of a first length from a cantilever-spring section in the first pattern and a probe-contact of a second length from a cantilever-spring section in the second pattern such that when the patterns are positioned to form contact pairs and the base is formed, the probe-contacts in each pair are spaced from each other and each probe terminates at a contact area suitable for the leads of a device to be tested.

9. The method of claim 8 wherein the conductors in the second pattern are imperforate flat members having substantially straight edges and wherein the common bar insulator forming step further comprises:
 molding a continuous bar of electrically insulative material along and about the conductors in the second pattern, thereby securing said conductors together, said bar being of sufficient width to uniformly touch the conductors in the first pattern and being of uniform cross section and sufficiently strong along its length that forces imparted to ones of the conductors in the second pattern are substantially distributed through the continuous bar to the other conductors in the second pattern.

10. The method of claim 9 wherein the conductors in the first and second patterns are imperforate flat members having substantially straight edges and wherein the base forming step further comprises:
 molding a continuous base of electrically insulative material along and about the conductors in the first and the second patterns, thereby securing said conductors together, said base being of uniform cross section and sufficiently strong along its length that forces imparted to ones of the conductors are substantially distributed through the continuous base to the other conductors.

11. The method of claim 10, further including the step of:
 selecting the material of the electrically conductive sheet used to form the patterns to be a sheet of substantially uniform matallurgical composition and forming such patterns from virtually unstressed portions of the sheet located inward of the sheet edges;
 forming in combination with the conductors of each pattern at least one connective member extending transversely of and attached to the ends of the conductors, said member for maintaining constant the position of each conductor in each pattern relative to the other conductors in the respective pattern as the patterns are formed from the sheet; and
 removing each connective member from a respective pattern after the patterns have been positioned and the base has been formed, whereby the relative positions of the conductors in each pattern are maintained constant from the sheet to the test head.

12. The method of claim 11 wherein the electrically conductive sheet used to form the patterns is selected of a metal susceptible to precipitation aging for hardness, further comprising, before a connective member is removed:
 heat treating the patterns at a temperature and for a time to develop spring temper in the conductors sufficient to fully return the conductors to their original shape after each flexing cycle.

* * * * *